(12) United States Patent
Grohmann et al.

(10) Patent No.: US 7,880,366 B2
(45) Date of Patent: Feb. 1, 2011

(54) THREE-DIMENSIONAL STACK-TYPE PIEZO ELEMENT AND PIEZOELECTRIC ACTUATOR HAVING SUCH A STACK-TYPE PIEZO ELEMENT

(75) Inventors: Boris Grohmann, Taufkirchen (DE); Peter Konstanzer, Taufkirchen (DE); Stefan Storm, Unterschleissheim (DE)

(73) Assignee: EADS Deutschland GmbH, Ottobrunn (DE)

( * ) Notice: Subject to any disclaimer, the term of this patent is extended or adjusted under 35 U.S.C. 154(b) by 31 days.

(21) Appl. No.: 12/158,617

(22) PCT Filed: Dec. 8, 2006

(86) PCT No.: PCT/DE2006/002189

§ 371 (c)(1),
(2), (4) Date: Nov. 21, 2008

(87) PCT Pub. No.: WO2007/071231

PCT Pub. Date: Jun. 28, 2007

(65) Prior Publication Data

US 2009/0079301 A1    Mar. 26, 2009

(30) Foreign Application Priority Data

Dec. 21, 2005   (DE) .................. 10 2005 061 752

(51) Int. Cl.
*H01L 41/08* (2006.01)

(52) U.S. Cl. ....................... 310/328; 310/367

(58) Field of Classification Search .......... 310/328
See application file for complete search history.

(56) References Cited

U.S. PATENT DOCUMENTS

| 3,873,191 | A | | 3/1975 | Veret et al. |
| 3,939,467 | A | * | 2/1976 | Cook et al. ............. 367/155 |
| 4,814,659 | A | | 3/1989 | Sawada |
| 5,068,566 | A | * | 11/1991 | Culp ................... 310/328 |
| 5,136,201 | A | * | 8/1992 | Culp ................... 310/328 |
| 5,939,816 | A | * | 8/1999 | Culp ................... 310/328 |
| 6,043,587 | A | | 3/2000 | Jaenker |
| 6,076,776 | A | | 6/2000 | Breitbach et al. |
| 6,260,795 | B1 | | 7/2001 | Gay et al. |
| 6,404,107 | B1 | | 6/2002 | Lazarus et al. |
| 6,813,815 | B2 | * | 11/2004 | Namerikawa et al. ..... 29/25.35 |

(Continued)

FOREIGN PATENT DOCUMENTS

DE      197 32 571 A1      7/1998

(Continued)

OTHER PUBLICATIONS

Form PCT/ISA/220 (two (2) pages), International Search Report dated Mar. 8, 2007 w/English translation of pertinent portion (five (5) pages) and Form PCT/ISA/237 (eight (8) pages) for a total of (fifteen (15) pages).

(Continued)

*Primary Examiner*—Mark Budd
(74) *Attorney, Agent, or Firm*—Crowell & Moring LLP

(57) ABSTRACT

A three-dimensional stack-type piezo element has at least one surface that is shaped perpendicular to layer planes of the stack, so that, at least in sections, it is not parallel to a stacking direction of the piezo element.

18 Claims, 3 Drawing Sheets

U.S. PATENT DOCUMENTS

2006/0214065 A1 9/2006 Jaenker

FOREIGN PATENT DOCUMENTS

| DE | 197 04 389 A 1 | 8/1998 |
| --- | --- | --- |
| DE | 197 12 034 A1 | 9/1998 |
| DE | 197 45 468 C1 | 4/1999 |
| DE | 103 04 530 A1 | 8/2004 |
| EP | 0 100 275 A1 | 2/1984 |
| WO | WO 96/31333 A1 | 10/1996 |
| WO | WO 01/31715 A1 | 5/2001 |

OTHER PUBLICATIONS

International Preliminary Report dated Nov. 6, 2008 with partial English translation of the Written Opinion of the International Searching Authority (Twelve (12) pages).

German Office Action, dated Jun. 22, 2010 (4 pages).

* cited by examiner

THREE-DIMENSIONAL STACK-TYPE PIEZO ELEMENT AND PIEZOELECTRIC ACTUATOR HAVING SUCH A STACK-TYPE PIEZO ELEMENT

BACKGROUND AND SUMMARY OF THE INVENTION

This application is a national stage of International Application No. PCT/DE2006/002189, filed Dec. 8, 2006, which claims priority under 35 U.S.C. §119 to German Patent Application No. 10 2005 061 752.2, filed Dec. 21, 2005, the entire disclosure of which is herein expressly incorporated by reference.

The use of piezo-electric elements is generally known. Such piezo elements are used, for example, to detect deformations in components by mounting them on components so that they move along with the deformation, causing a charge transfer in the piezo element. On the other hand, piezo elements are also used to influence (deform) a component in a targeted manner; that is, the piezo element is supplied with voltage and the resulting deformation is utilized. Piezo elements are used mainly when special complex deformation processes are required on the component and the surface of the components should be as undamaged and smooth as possible in all deformation conditions. Examples of applications exist, for example, in aeronautical engineering in the case of aerodynamic profiles, and also for large concave mirrors, for example, in telescopes, and more.

In the field of aeronautical engineering, piezo elements are used to examine the flow around aerodynamic profiles. German Patent Document DE 103 04 530 A1 describes an arrangement in which piezo actuators are inserted at least in parts in an aerodynamic profile. When the piezo actuators are acted upon electrically, they change length, essentially in the direction of the planes of the cover skins of the profile. The profile has a forward profile region and a rearward profile region situated in the downward current, and is bounded by pressure-side and suction-side cover skins which converge in a trailing edge of the profile. In addition to circuit connections, the piezo-electric actuators contain piezo elements with a so-called longitudinal effect (d33 effect), in which the change of length of the piezo-electric material takes place in the direction of the electric field, permitting an effective introduction of forces into the aerodynamic profile. In the piezo-electric actuators used in German Patent Document DE 103 04 530 A1, which utilize the d33 effect, the change of length of the piezo-electric material is in the direction of the electric field, and is greater than the piezo effect (d31 effect), in which the change of length takes place perpendicular to the electric field.

The d33 actuators used in German Patent Document DE 103 04 530 A1 are produced by cutting slices having a thickness d out of a stack-shaped piezo element, in the longitudinal direction, to form flat disks as shown in FIG. 1a. The latter are then placed onto or into a curved structure, specifically the aerodynamic profile. The actuators have a narrow thickness and are essentially plate-shaped or are flat rectangular parallelepipeds, so they do not influence the aerodynamic conditions or influence them only little. However, since the piezo-electric actuator is to be mounted on curved or shaped profiles (or is to be placed in the latter) and is to generate aerodynamic resistance at the curved aerodynamic profile, the piezo elements contained in the piezo actuators frequently have to be bent or curved. As a result, they break easily during the adaptation or mounting on such curved structures, especially because the d33 piezo materials are relatively brittle. In addition, the layers of the piezo element may possibly be displaced with respect to one another or deformed, which in turn may affect the precision and operating capacity of the piezo material.

Conventional d31 piezo elements are therefore frequently used. In such elements, the change of length takes place perpendicular to the electric field, and they therefore have a thinner design and are more flexible with respect to deformation. However, the piezo effect (the achievable deformation) is less, so that the performance of the d31 piezo elements is often not satisfactory for influencing the components in a targeted manner.

Based on the above, one object of the invention is to provide a piezo element (and an actuator having such a piezo element for influencing a mechanical component), which is a high-performance actuator and is adapted to the shape of the component, the shape of the occurring load, and/or the load to be applied.

This and other objects and advantages are achieved by the piezo element according to the invention, in which a surface of the stack-type piezo element is shaped to correspond to a surface of the initial stack-type piezo element in a rectangular parallelepiped shape, which surface extends perpendicular to the layer planes of the stack (parallel to the stacking direction). As a result, the stack-type piezo element may have a three-dimensional shaping and can be adapted to the design of an aerodynamic profile. Because the piezo effect occurs perpendicular to the layer planes, (that is, in the stacking direction), the shaping of the piezo element does not affect its performance.

A shaped surface means that the surface is, for example, not planar; that is, one lateral surface of the rectangular parallelepiped of the initial stack of a stack-type piezo element is replaced, for example, by a curved, wavy or otherwise designed surface. As an alternative, a plane surface may also form the shaped surface which, however, it is disposed at a nonzero angle with respect to the stacking direction, resulting, for example, in a piezo element which, as a whole, has the shape of a prism. Instead of two mutually opposite parallel surfaces of the stack, in this case, the two opposite surfaces are disposed relative to one another at an angle that is neither 0° nor 90°.

In each case, the layers of electrically conductive material that form the stack-type piezo element are not all shaped the same. That is, shaping of a surface means that, in a "virtual" disassembly of the stack-type piezo element into the individual conductive layers, the individual plates of the stack would have different plate shapes. There is no special limitation for the design of the surfaces. They can, on the contrary, be adapted to the corresponding application of the piezo element as required.

A shaped surface is therefore any two-dimensionally (2D) or three-dimensionally (3D) machined stack element. Two-dimensional machining refers to machining in one plane of the stack-type piezo element, which leads to a stack of a varying thickness, while three-dimensional machining indicates a machining of the stack-type piezo element in several planes, from which an almost arbitrarily contoured stack-type piezo element is created which has freely designable ascending and descending shapes. In three-dimensional machining, the contour of the piezo element is a function of all three directions in space, while, in the case of the two-dimensional machining, the contour of the piezo element does not vary in one of the three dimensions in space.

Shaping of the shaped surface is performed after the construction of the piezo element. A machining process, (such as, for example, a sawing, grinding, drilling, turning, broaching, lapping or milling process, or a combination of theses processes) is used.

Thus, for a d33 piezo actuator, conventionally, first a piezo element may be constructed as a stack; that is, in a form that is not adapted to the shape (for example, as a rectangular parallelepiped with two approximately square lateral surfaces which simultaneously are layer plane surfaces). Subsequently, before it is mounted on a component or used as an actuator, at least one surface of the stack is adapted to the shape of the component, to the expected loading of the piezo element, to the load that is to be placed by the piezo element, or to a combination of these demands. To this end, at least one surface of the rectangular parallelepepid shaped stack, which surface is parallel to the stacking direction, is machined, for example, mechanically.

For aerodynamic applications, it may be preferred that the shape-adapted surface of the piezo-electric actuator, specifically the surface facing the exterior side of an aerodynamic profile, be curved so that it corresponds to the profile contour. As a result, the aerodynamic shape of the profile can essentially remain unaffected, while at the same time a piezo element is provided for influencing of the aerodynamic component. In the thickness direction, the piezo element may, for example, have a constant dimension, which means that the surface situated opposite the shaped surface is also correspondingly shaped. Thus, for example, the piezo element may have a concavely curved and a convexly curved exterior surface. As an alternative, the piezo element may have a variable thickness in that, for example, either no shaping or a different shaping is performed at the other surfaces.

By varying its thickness, the piezo element can, for example, be adapted to loads which occur at the component and are introduced into the piezo element. Also in the case of a three-dimensional profile, a three-dimensional influencing of the component can be achieved by means of a variable thickness of the piezo element.

The piezo element preferably is a d33 stack-type piezo element, in which the piezo effect occurs in the direction perpendicular to the stack layers (that is, in the stacking direction). Because of the shaping of the actuators or of the stack-type piezo elements, the actuators do not have to be further bent or deformed during the installation. Thus, the risk of breakage during the installation (for example, by means of gluing, clamping or screwing), as a result of the bending as well as a deformation of the layers or of the layers with respect to one another, is avoided. Therefore, the capacity of the piezo actuator is maintained and the wear of the piezo actuators is reduced.

Other objects, advantages and novel features of the present invention will become apparent from the following detailed description of the invention when considered in conjunction with the accompanying drawings.

DETAILED DESCRIPTION OF THE DRAWINGS

Figure 1A:
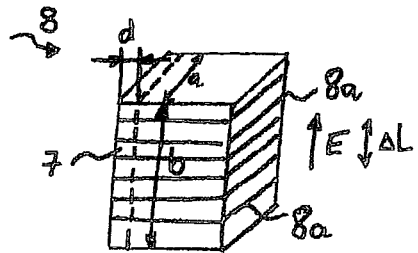
FIG. 1a is a schematic view of a stack-shaped piezo-electric element for explaining the d33 effect.
Figure 1B:
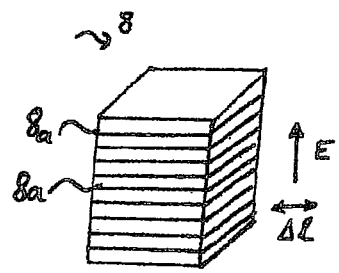
FIG. 1b is a schematic view of a stack-shaped piezo-electric element for explaining the d31 effect.

FIGS. 1a and 1b are schematic views of a stack-shaped piezo-electric element 8, which is also called a "piezo stack". In each case, the piezo element consists of alternatingly arranged layers of an electrically conductive material in the form of electrodes 8a, and piezo-electric material 7. In the stacks in FIGS. 1a and 1b respectively, the layers are in the shape of a rectangular parallelepiped and have a uniform cross-sectional shape in the direction perpendicular to the stacking direction. The electric field E, which is provided by the electrodes 8a, acts on the piezo element according to FIG. 1a in the stacking or longitudinal direction of the piezo-electric element 8. As a result of the electric field E, the piezo-electric material expands in the direction of the electric field E. This change of length is marked $\Delta L$ in FIG. 1a. The dimensions of a stack, typically the lateral length of the surfaces of the stacking elements perpendicular to the stacking direction, amount to approximately 5-60 mm, as does the height b in the stacking direction.

In the piezo element 8 illustrated in FIG. 1a (the so-called d33 piezo element) the change of length $\Delta L$ when an electric field is applied, is greater than the change of length $\Delta L$ shown in FIG. 1b in the case of a piezo element with a d31 effect, which takes place transversely to the electric field E.

According to the invention, in a d33 piezo stack according to FIG. 1a, at least one lateral surface of at least one portion of the layers forming the stack (that is, of the plate-shaped elements), which lateral surface is perpendicular to the layer planes of the stack, is mechanically machined by, for example, material removal. Shaping processes, such as sawing, grinding, drilling, turning, broaching, lapping and/or milling can be used. This results in a shaped piezo element in which at least one lateral surface is, for example, curved. Alternatively, although planar, such surface may be disposed at an angle with respect to the stacking direction, so that it is no longer parallel to the stacking direction, and the entire piezo element no longer has the shape of a rectangular parallelepiped. This means that the individual layer planes no longer have the same cross-sectional shape in the direction perpendicular to the stacking direction.

Such a stack-type piezo element, preferably formed from a stack-type piezo element with a d33 effect, can be used as a piezo-electric actuator in that pertaining electrical connections are supplemented in a known manner. Respective uses are illustrated in FIGS. 2a to 7b.

Figure 2A:
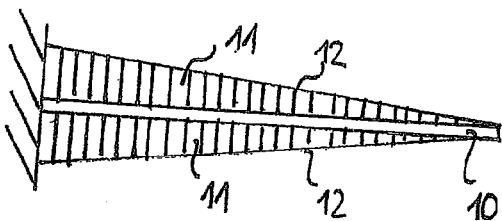
FIG. 2a is a view of a piezo-electric actuator according to the invention having two three-dimensional stack-type piezo elements according to the invention for the bending of a plate.

FIG. 2a shows two prism-shaped piezo-elements (that is, elements having a triangular cross-section or a varying thickness). As viewed in FIG. 2a, the prism-shaped piezo elements are applied to the top and bottom of a bendable carrier plate 10. One such piezo element 11 is mounted on the top side and the other is mounted on the bottom side of the carrier plate 10. In the embodiment illustrated in FIG. 2a, the piezo elements are mutually mirror symmetrical, and are actuated such that they are driven in an opposite manner, with one piezo actuator expanding, while the other simultaneously contracts. As a result, a bending can be introduced into the plate 10 and, for example, the bending behavior of the plate can be examined or controlled. As an alternative, the piezo elements can also be used for detecting loads at the plate in that the current flow is measured which is generated by the change of length caused in the piezo elements.

In the embodiment illustrated in FIG. 2a, the shapes of the piezo elements 11 are adapted to the load to be introduced into the carrier plate 10 (which is produced, for example, from composite material). The piezo elements 11 are connected with the carrier plate 10, for example, by gluing. Alternatively, it is also possible to connect the piezo elements 11 directly with one another in order to obtain a deformable component.

Figure 2B:
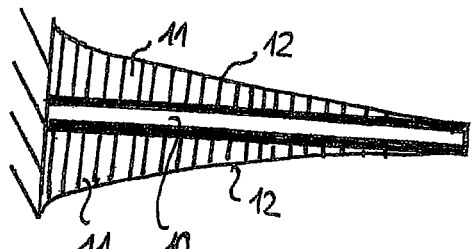
FIG. 2b is a view of another piezo-electric actuator for bending a plate.

In the embodiment illustrated in FIG. 2b, the piezo elements 11 are also intended to cause a bending plate to bend. They are still better adapted to the load to be introduced, however, in that the moment line at the bending beam 10 is traced in the cross-section of the piezo elements. By shaping the piezo elements 11 with at least one curved surface, it is possible to adapt the shape of the piezo elements 11 to the loads to be introduced into the component (here, the bending plate) that is to be influenced.

The shaped surface 12 of the stack 8 is the surface of the piezo element 11 which is on the top and on the bottom in the cross-sectional views according to FIGS. 2a and 2b respectively. In each piezo element, one plane of the stack is machined two dimensionally.

Figure 3A:
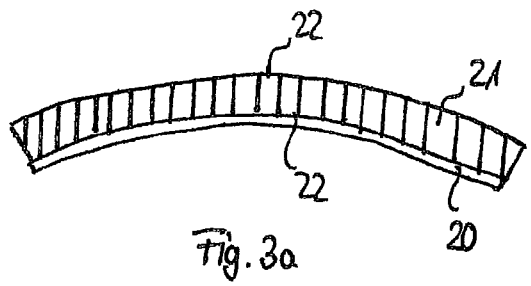
FIG. 3a is a view of a piezo-electric actuator according to the invention for bending a shell.
Figure 3B:
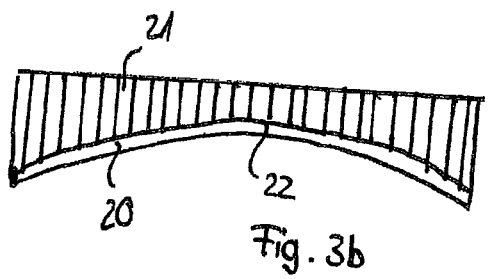
FIG. 3b is a view of an alternative piezo-electric actuator according to the invention for bending a shell.

FIGS. 3a and 3b show the use of piezo elements 21 shaped according to the invention for shell-type components 20, for example, concave mirrors for telescopes. In FIG. 3a, at least two surfaces 22 (specifically, the surface mounted on the shell component 20 and the surface situated opposite that surface 22) of a piezo stack 8 according to FIG. 1a are machined, in each case, resulting in curved surfaces. In contrast, in FIG. 3b, only one of the surfaces 22 of the stacks 8 is machined such that its contour is adapted to that of the shell component 20. In both cases, it is possible to connect a piezo element with a d33 effect with a curved component 20, without any mechanical stressing of the piezo element during the mounting on a curved component. When producing the piezo actuator according to FIG. 3a formed with two curved surfaces 22, the concave shape facing the component 20 is shaped first, and subsequently the opposite side is cut away such that the convex arching is obtained.

The shaped surfaces according to FIG. 3a are the concavely and convexly curved surfaces 22 which rest against the shell-shaped component or face away from it; in the embodiment of FIG. 3b, only the surface facing the shell-shaped component is shaped.

By means of the piezo actuators according to FIGS. 3a and 3b, a piezo actuator can therefore be applied to curved surfaces, without the necessity of bending the piezo actuator during the mounting, which bending could possibly damage the piezo element. The use of piezo actuators for shell-type components, such as mirrors, makes it possible, for example, for telescopic mirrors, to adjust the contour of the arching with a precision not achievable by other devices, thereby clearly improving the functioning of the telescopic mirror. The piezo actuators can be completely adapted to the contour, particularly the curvature, of the shell element 20.

Figure 4A:
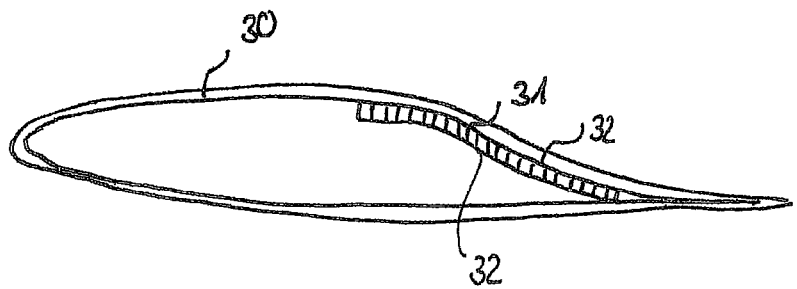
FIG. 4a is a view of a piezo-electric actuator for influencing an aerodynamic profile by bending, bulging or arching.
Figure 4B:
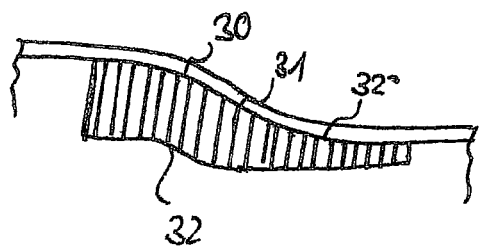
FIG. 4b is a view of an alternative piezo-electric actuator for influencing a profile by bending, bulging or arching.

This is, for example, also advantageous when, as illustrated in FIGS. 4a and 4b, the piezo actuators are used to influence aerodynamic profiles 30. FIG. 4a shows a piezo actuator 31 having a uniform thickness, while the piezo actuator 31 of FIG. 4b has a thickness that is adapted to the load to be introduced or to the deformation or influencing of the component. By means of such a piezo actuator 31, for example, the aerodynamic profile 30 can be bent, bulged or arched without noticeably influencing the surface of the aerodynamic profile. As a result, the flow characteristics around the aerodynamic profile can be examined or varied. Because the contour of the piezo actuators 31 is completely adapted to the exterior surface of the aerodynamic profile, without the need to bend the piezo element 31 itself for this purpose, almost arbitrarily shaped components can be influenced or deformed by means of such piezo actuators with high efficiency, when the thickness of the piezo actuator 31 is adapted to the type of loading, this can be done without any deformation of the outer contour.

The shaped surfaces correspond to the surfaces 32 which trace the contour of the aerodynamic profile. In FIG. 4b, the lower contoured surface is selected as a function of the loads to be introduced into the aerodynamic profile 30, so that a three-dimensional control of the profile 30 is possible.

Figure 5:
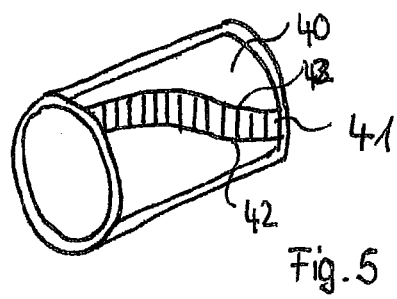
FIG. 5 is a view of a piezo-electric actuator according to the invention for influencing a component by torsion and denting.

FIG. 5 shows an arrangement in which a shell or cylinder-shaped component 40 can be stressed by torsion and denting by means of a piezo actuator 41 which has a constant thickness in the illustrated embodiment.

The piezo element 41 is preferably shaped three-dimensionally; that is, from the original piezo stack 8, which is illustrated in FIG. 1a, three-dimensional bodies are formed by cutting removal while the layer surfaces are not displaced with respect to one another or expanded or stressed by pull or tension.

Figure 6:
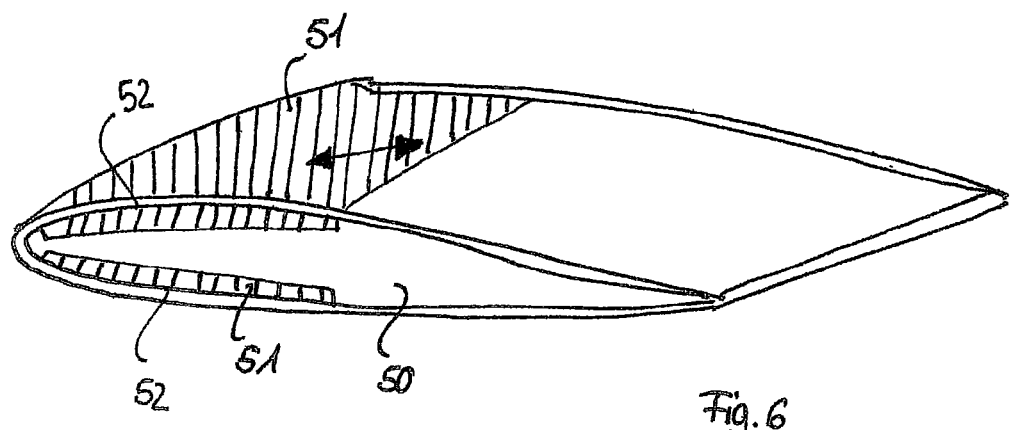
FIG. 6 is a perspective view of the arrangement of piezo-electric actuators according to the invention on an aerodynamic profile.

FIG. 6 shows an aerodynamic profile 50, where several d33 piezo actuators 51 with a respectively adapted surface shape are each arranged in a segment form. The outer contour of the aerodynamic profile 50 is not disturbed by the piezo actuators 51 because the future outer surfaces 52 of the piezo actuators are correspondingly shape-adapted by the mechanical machining of a stack. The arrangement of the piezo actuators on the aerodynamic profile 50 is such that the direction of the d33 effect may differ from one segment to the next and a targeted three-dimensional influencing of the component 50 thereby becomes possible. The influencing direction of the piezo actuator 51 which is at the top in FIG. 6 is indicated by an arrow (corresponding to the direction of the change of length). The piezo actuators 51 are therefore integrated into the structure and are completely adapted to the contour by cutting suitable geometries out of the stack 8; and their elongation direction is also adapted to the influencing to be applied. Depending to the requirements, the influencing direction can also be combined with anisotropic characteristics of the basic structure, for example, of the material used for this purpose, so that the elongation direction is utilized in a targeted manner in order to introduce certain influences by means of the piezo actuator 51 into the aerodynamic profile 50.

Finally, by a suitable selection of the geometry of the piezo actuator, it also becomes possible to make the latter as unsusceptible as possible with respect to loads introduced into the basic component, in that the piezo actuator itself, as a result of the selection of a three-dimensional shape, is adapted with respect to its stiffness and load absorption capacity to the expected forces or moments.

Figure 7A:
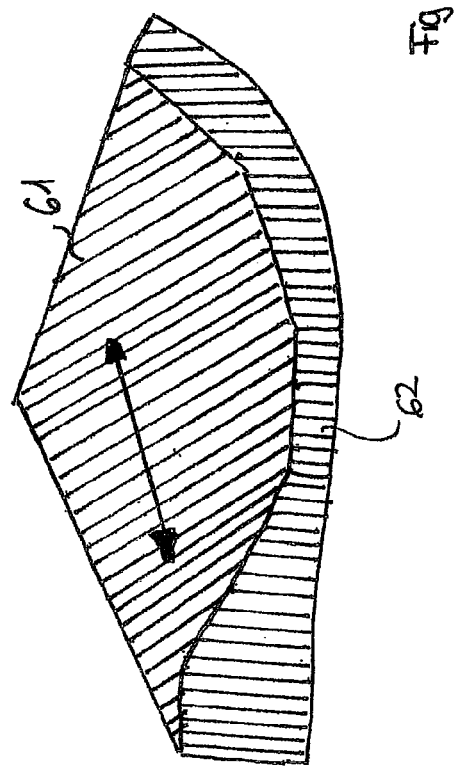
FIG. 7a is a view of a variably contoured three-dimensional stack-type piezo element according to the invention.
Figure 7B:
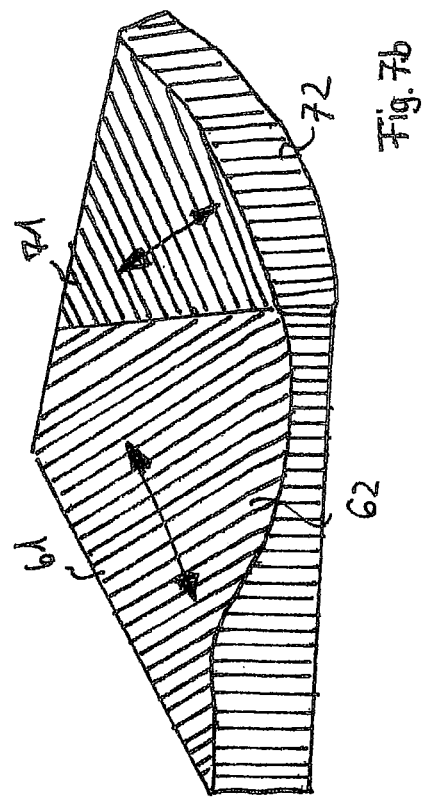
FIG. 7b is a view of a segmented three-dimensional stack-type piezo element according to the invention.

FIGS. 7a and 7b finally show three-dimensionally shape-adapted piezo actuators. In FIG. 7b a segment-shaped piezo actuator with a different direction of the d33 effect is provided because the piezo actuator is formed of several shaped stacks and is segmented. The direction of the d33 effect (elongation direction) is indicated by an arrow. The piezo actuator 61 and 71 (FIGS. 7a and 7b) are contoured and have a variable thickness. By the orientation of the active direction of the d33 effect corresponding to the target, particularly when there is an additional segmenting, virtually arbitrary influences can be introduced into the component.

According to the invention, instead of a conventional rectangular parallelepiped shaped stack of piezo-electric materials and electrodes, after stacking, such a stack is shaped on at least one surface of the stack, which is perpendicular to the stacking plane. The piezo actuator is thus adapted to the shape of a component, to the loads to be generated by it, and/or the loads correspondingly expected for the piezo actuator.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

The invention claimed is:

1. A piezoelectric actuator having a three-dimensional piezo element for the mounting on a basic structure, wherein:
   said piezo element comprises a stack of layers of piezo-electric material;
   at least one surface of the piezo element is two-dimensionally or three-dimensionally shaped, in a direction that is perpendicular to the layers of the stack;
   the at least one shaped surface has a surface contour that corresponds to a contour of the basic structure on which the actuator is to be mounted;
   the stacked piezo element is a d33 piezo element.

2. A piezoelectric actuator according to claim 1, wherein the at least one surface of the stack-type piezo element, at least in sections, is not parallel to a stacking direction of the piezo element.

3. A piezoelectric actuator according to claim 1, wherein the at least one shaped surface of the stack-type piezo element is curved.

4. A piezoelectric actuator according to claim 1, wherein:
   said piezoelectric actuator is a component of a structural member that is subject to a mechanical load; and
   the at least one shaped surface of the piezo element has a contour that corresponds to said mechanical load.

5. A piezoelectric actuator according to claim 1, wherein the actuator contains at least two segments consisting of three-dimensional stack-type piezo elements.

6. A piezoelectric actuator according to claim 5, wherein orientation of the stacking directions of the segments varies.

7. A piezoelectric actuator according to claim 5, wherein the segments are operable independently of one another.

8. A profiled member having a piezoelectric actuator according to claim 1.

9. The profiled member according to claim 8, wherein the actuator is integrated into the profiled member whereby the profile has a substantially smooth surface.

10. The profiled member according to claim 8, wherein a plurality of mutually independently operable piezoelectric actuators are provided at different positions on or in the profiled member.

11. A piezoelectric actuator having a mounting surface with a contour that conforms to at least one of i) a contour of a component on which the actuator is to be mounted, ii) a load that is to be exerted on the actuator, and iii) a deforming influence that is to be exerted by the actuator; wherein:
   said actuator comprises a d33 piezo element that is formed by a plurality of layers of piezoelectric material which are stacked in a stacking direction;
   said mounting surface extends in said stacking direction, such that when said actuator is mounted on a corresponding surface, said layers are situated in parallel planes that extend in a direction that is substantially normal to said corresponding surface; and
   said mounting surface has a surface contour that varies in said stacking direction.

12. The piezoelectric actuator according to claim 11, wherein perimeter dimensions and shape of the layers of piezoelectric material vary as between respective layers in the stacking direction.

13. The piezoelectric actuator according to claim 12, wherein said surface contour is planar and is inclined relative to said stacking direction.

14. The piezoelectric actuator according to claim 12, wherein said perimeter dimensions and shape vary as a function of a mechanical loading to which said component is subject.

15. A piezoelectric actuator, having a piezo element comprising a stack of alternating parallel planar layers of piezoelectric material and planar electrodes, which electrodes, when electrically energized, generate an electric field that is oriented in a stacking direction that is perpendicular to the respective layers; wherein:
   said piezo element is a d33 piezo element, whereby generation of said electric field causes said layers of piezoelectric material to expand in the stacking direction, parallel to said electric field;
   a surface of said piezo element formed by edges of said electrodes and said layers of piezoelectric material has a surface contour that varies in at least said stacking direction.

16. The piezoelectric actuator according to claim 15, wherein perimeter dimensions and shape of the layers of piezoelectric material vary as between respective layers in the stacking direction.

17. The piezoelectric actuator according to claim 16, wherein said surface contour is planar and is inclined relative to said stacking direction.

18. The piezoelectric actuator according to claim 16, wherein said perimeter dimensions and shape vary as a function of a mechanical loading of a component to which the actuator is subject.

* * * * *